US012422890B2

(12) United States Patent
Wang et al.

(10) Patent No.: US 12,422,890 B2
(45) Date of Patent: Sep. 23, 2025

(54) METAL SUPPORT AND FLEXIBLE DISPLAY DEVICE

(71) Applicant: BOE Technology Group Co., Ltd., Beijing (CN)

(72) Inventors: Haoran Wang, Beijing (CN); Paoming Tsai, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 916 days.

(21) Appl. No.: 17/423,254

(22) PCT Filed: Feb. 2, 2021

(86) PCT No.: PCT/CN2021/074888
§ 371 (c)(1),
(2) Date: Jul. 15, 2021

(87) PCT Pub. No.: WO2021/196870
PCT Pub. Date: Oct. 7, 2021

(65) Prior Publication Data
US 2023/0157147 A1 May 18, 2023

(30) Foreign Application Priority Data
Mar. 31, 2020 (CN) .................. 202010243418.0

(51) Int. Cl.
*H10K 77/10* (2023.01)
*B32B 3/26* (2006.01)
(Continued)

(52) U.S. Cl.
CPC .............. *G06F 1/1637* (2013.01); *B32B 3/26* (2013.01); *B32B 3/30* (2013.01); *B32B 7/12* (2013.01);
(Continued)

(58) Field of Classification Search
CPC ..... G06F 1/1637; G06F 1/1652; B32B 3/266; B32B 3/30; B32B 3/26; B32B 7/12;
(Continued)

(56) References Cited

U.S. PATENT DOCUMENTS

2016/0170132 A1* 6/2016 Sugimoto ............ G02B 6/0078
362/611
2020/0052239 A1 2/2020 Kim et al.
(Continued)

FOREIGN PATENT DOCUMENTS

CN 110518039 A 11/2019
CN 110767096 A 2/2020
(Continued)

OTHER PUBLICATIONS

Machine Translation, Cao et al., CN 110767096 A, Feb. 7, 2020. (Year: 2020).*
(Continued)

*Primary Examiner* — Michael E. La Villa
(74) *Attorney, Agent, or Firm* — IPro, PLLC

(57) ABSTRACT

The present disclosure relates to a metal support including a bendable region, a non-bendable region, and at least one patterned region covering at least the bendable region. The bendable region is capable of bending in a first direction, a plurality of columns of hollowed-out parts arranged side by side along the first direction are arranged in the patterned region, each column of the hollowed-out parts includes a plurality of openings arranged at intervals along the second direction, and the patterned region includes two first edges arranged opposite to each other in the first direction, the hollowed-out part near the first edge is arc-shaped, convex sides of two arcs face each other, and the first direction and the second direction are perpendicular. The present disclosure also relates to a flexible display device.

18 Claims, 7 Drawing Sheets

(51) Int. Cl.
*B32B 3/30* (2006.01)
*B32B 7/12* (2006.01)
*B32B 15/04* (2006.01)
*B32B 15/06* (2006.01)
*B32B 15/08* (2006.01)
*G06F 1/16* (2006.01)
*G09F 9/30* (2006.01)
*H05K 5/02* (2006.01)
*H10K 102/00* (2023.01)

(52) U.S. Cl.
CPC .............. *B32B 15/04* (2013.01); *B32B 15/06* (2013.01); *B32B 15/08* (2013.01); *G06F 1/1652* (2013.01); *G09F 9/301* (2013.01); *H05K 5/0217* (2013.01); *B32B 3/266* (2013.01); *B32B 2307/732* (2013.01); *B32B 2457/206* (2013.01); *H10K 77/111* (2023.02); *H10K 2102/311* (2023.02); *Y02P 70/50* (2015.11); *Y10T 428/12361* (2015.01); *Y10T 428/12368* (2015.01); *Y10T 428/12493* (2015.01); *Y10T 428/12535* (2015.01); *Y10T 428/12562* (2015.01); *Y10T 428/12569* (2015.01)

(58) Field of Classification Search
CPC ......... B32B 15/04; B32B 15/08; B32B 15/06; B32B 2307/732; B32B 2457/206; G09F 9/301; H05K 5/0217; H10K 77/111; H10K 2102/311; Y02P 70/50; Y10T 428/12361; Y10T 428/12368; Y10T 428/12493; Y10T 428/12562; Y10T 428/12569; Y10T 428/12535

See application file for complete search history.

(56) References Cited

U.S. PATENT DOCUMENTS

| | | | |
|---|---|---|---|
| 2021/0141419 A1 | 5/2021 | Wang et al. | |
| 2021/0153363 A1 | 5/2021 | Cao et al. | |
| 2023/0157147 A1 | 5/2023 | Wang et al. | |
| 2023/0200201 A1* | 6/2023 | Wang .................... | B32B 15/08 361/807 |

FOREIGN PATENT DOCUMENTS

| | | |
|---|---|---|
| CN | 110796955 A | 2/2020 |
| CN | 110827693 A | 2/2020 |
| CN | 111312080 A | 6/2020 |

OTHER PUBLICATIONS

PCT/CN2021/074888 international search report and written opinion.

U.S. Appl. No. 18/110,327 Non-Final Rejection dated May 7, 2025.

* cited by examiner

METAL SUPPORT AND FLEXIBLE DISPLAY DEVICE

CROSS-REFERENCE TO RELATED APPLICATIONS

The present application is the U.S. national phase of PCT Application No. PCT/CN2021/074888 filed on Feb. 2, 2021, which claims a priority of the Chinese patent application 202010243418.0 filed on Mar. 31, 2020, which are incorporated herein by reference in their entirety.

TECHNICAL FIELD

The present disclosure relates to the technical field of display product fabrication, and more particularly, to a metal support and a flexible display device.

BACKGROUND

The advent of organic light-emitting diode (OLED) flexible display technology has expanded the imagination of the field of flexible displays. Based on the flexible characteristics of polymer materials, flexible polymer film stacking is widely used in flexible OLED display modules. However, due to the low modulus (100 KPa-5 GPa) of raw materials, the overall support and rigidity of flexible display modules with polymer films and adhesives stacked alternately are poor, and high temperature softening and stress creep further restrict the application of all-polymer flexible display modules.

Metallic materials have relatively high modulus (10 GPa-200 GPa), relatively strong hardness and rigidity, which can provide good overall support and rigidity supplement for flexible display module, and can also correct the problems of high temperature softening and stress creep. However, the metallic materials with high hardness are difficult to machine, and stress concentration easily appear at the edge of bendable region, and long-time large stress failure or high-cycle dynamic bending failure easily occurs at the edge position.

SUMMARY

In a first aspect, provided is a metal support including a bendable region and a non-bendable region, and at least one patterned region covering at least the bendable region, wherein the bendable region is capable of bending in a first direction, a plurality of columns of hollowed-out parts arranged side by side along the first direction are arranged in the patterned region, each column of the hollowed-out parts includes a plurality of openings arranged at intervals along a second direction, and the patterned region includes two first edges arranged opposite to each other in the first direction, the hollowed-out part near the first edge is arc-shaped, and convex sides of two arcs surface each other, and the first direction and the second direction are perpendicular.

Optionally, the bendable region includes a first center line extending in the first direction and a second center line extending in the second direction, a plurality of columns of the hollowed-out parts are symmetrically divided in the first center line and symmetrically distributed in the second center line, and the first centerline is perpendicular to the second centerline.

Optionally, a first patterned region located in a middle part and a second patterned region symmetrically arranged on two opposite sides of the first patterned region are arranged in the first direction, the first patterned region at least includes a first column of hollowed-out parts, and a long axis of each opening in the first column of hollowed-out parts coincides with the second center line.

Optionally, in the first patterned region and the second patterned region, except for the first column of hollowed-out parts, a connecting line of center points of a plurality of openings in each column of the hollowed-out parts forms an arc line, and along the first direction, the farther the arc line is from the second center line, the greater the radian of the arc line is.

Optionally, each of the openings is of a strip-shaped structure extending along an extension direction of the hollowed-out part, and the arc line is tangent to the long axis of each opening corresponding to the arc line.

Optionally, the second patterned region includes a third patterned region and a fourth patterned region along the first direction, the third patterned region is adjacent to the first patterned region, the first patterned region cover the bendable region, and the third patterned region and the fourth patterned region cover a part of the non-bendable region.

Optionally, a connection part is arranged between two adjacent openings in each column of the hollowed-out parts, and the projection of the connection part in the first direction is located on a corresponding opening of an adjacent hollowed-out part.

Optionally, in two adjacent columns of hollowed-out parts located in the same region, a connection part between two adjacent openings in one column of the hollowed-out parts is a first connection part, and an opening corresponding to the first connection part on the other column of the hollowed-out parts is a first opening; and the projection of the first connection part in the first direction is located at one-half of the first opening.

Optionally, a connection part between two adjacent openings in a column of the hollowed-out parts in the third patterned region is a second connection part, and an opening corresponding to the second connection part in a column of the hollowed-out parts in the first patterned region is a second opening; and the projection of the second connection part in the first direction is located at a quarter of the second opening.

Optionally, a connection part between two adjacent openings in a column of the hollowed-out parts in the fourth patterned region is a third connection part, and an opening corresponding to the third connection part in a column of the hollowed-out parts in the third patterned region is a third opening; and the projection of the third connection part in the first direction is located at a quarter of the third opening.

Optionally, a length of the opening in the hollowed-out part in the first patterned region in the second direction is a first length, and a length of the opening in the hollowed-out part in the third patterned region in the second direction is a second length, and a length of the opening in the hollowed-out part of the fourth patterned region in the second direction is a third length; and the first length is twice the second length, and the second length is twice the third length.

Optionally, each of the openings is of a strip-shaped structure extending along the extension direction of the hollowed-out part, and the arc line coincides with the long axis of each opening corresponding to the arc line.

Optionally, the plurality of openings in the same column of hollowed-out parts do not have the same length.

Optionally, the openings in each column of the hollowed-out parts have a width in the first direction of 0.2 mm, and a distance between two adjacent columns of the hollowed-out parts in the first direction is 0.4 mm.

Optionally, the length of the patterned region in the first direction gradually increases from the center to the edge along its extension direction.

Optionally, an arrangement density of the openings in the patterned region gradually decreases from the middle to the edge in the second direction.

Optionally, the openings are through holes or semi-through holes.

Optionally, the patterned region includes two second edges oppositely arranged along the second direction, and the openings at the second edges of the plurality of columns of the hollowed-out parts include a first opening penetrating the second edge and a second opening not penetrating the second edge, and the first opening and the second opening are spaced apart.

Optionally, the patterned region includes two second edges oppositely disposed along the second direction, and the openings at the second edges of the plurality of columns of hollowed-out parts penetrate through the second edges.

Optionally, the opening is filled with an elastic material.

Optionally, an adhesive layer on the bendable region and the non-bendable region is further included, the adhesive layer includes a first surface adjacent to the bendable region and a second surface opposite the first surface, a part, corresponding to the bendable region, of the first surface has a protrusion part for filling the opening, and the second surface is a planar structure.

In a second aspect, embodiments of the present disclosure also provide a flexible display device including the metal support described above.

DETAILED DESCRIPTION

Figure 1:
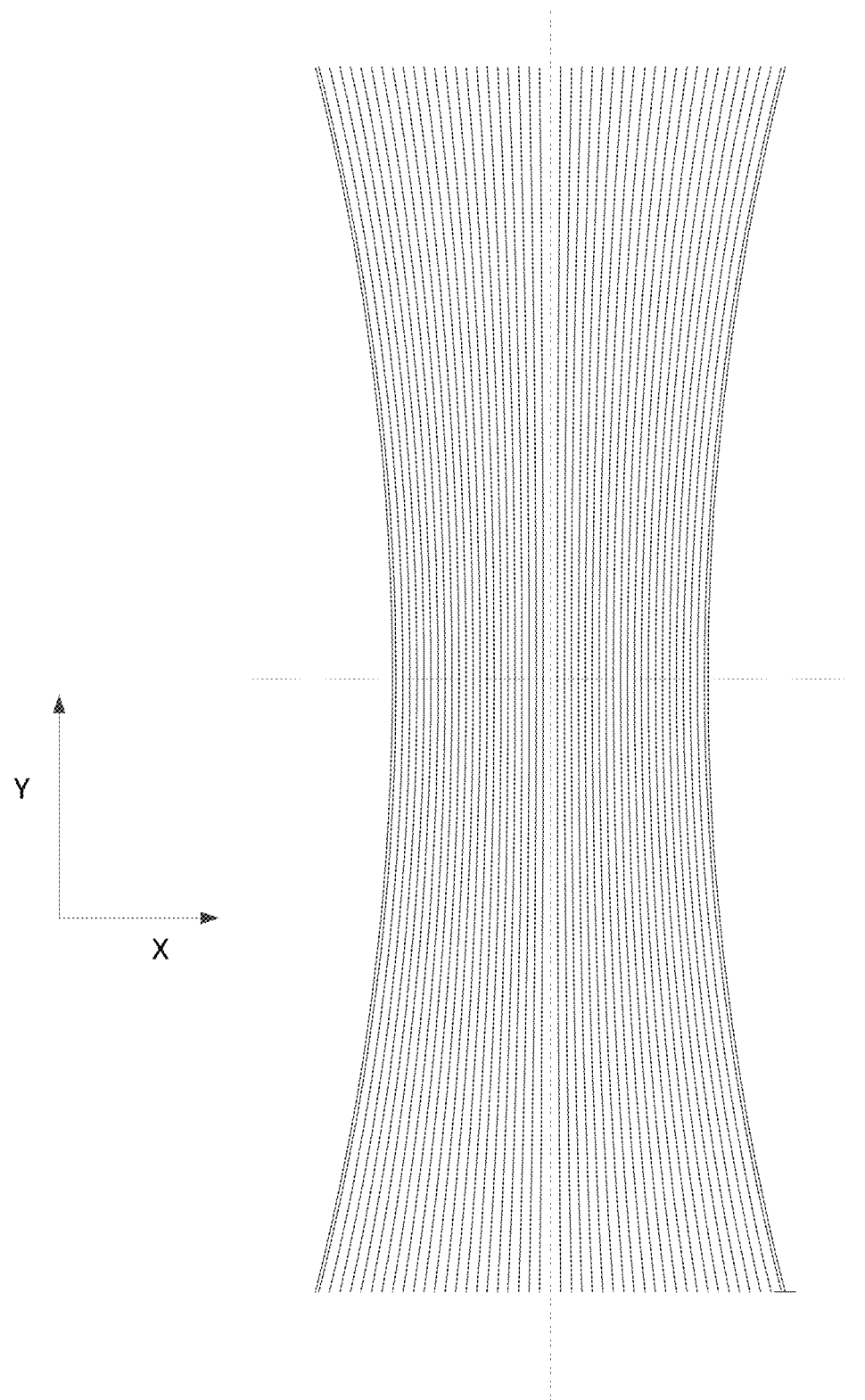
FIG. 1 is a schematic diagram of a stress distribution contour of a bendable region in an embodiment of the present disclosure.

To further clarify the objects, features and advantages of the embodiments of the present disclosure, a more particular description of the present disclosure will be rendered by reference to specific embodiments thereof which are illustrated in the appended drawings. Obviously, the embodiments described in the present disclosure are part of the all embodiments, in which some, but not all embodiments of the disclosure are shown. Based on the embodiments in the present disclosure, all other embodiments obtained by a person of ordinary skill in the art without inventive effort fall within the scope of protection of this disclosure.

In the description of the present disclosure, it should be understood that the orientation or positional relationship indicated by the terms "center", "upper", "lower", "left", "right", "vertical", "horizontal", "inner", "outer", and the like is based on the orientation or positional relationship shown in the drawings, and is merely for convenience of describing the disclosure and simplifying the description, but not intended or implied that the referenced device or element must have a particular orientation, be constructed and operated in a particular orientation, and thus should not be construed as limiting the present disclosure. The terms "first" and "second" are used for descriptive purposes only and are not to be construed as indicating or implying relative importance.

This embodiment provides a metal support 22. Referring to FIGS. 1-8, the metal support 22 includes a bendable region 11, a non-bendable region 12, and at least one patterned region covering at least the bendable region 11, wherein the bendable region 11 is capable of bending along a first direction, a plurality of columns of hollowed-out parts 15 arranged side by side along the first direction (referring to the X direction in FIG. 1) are arranged in the patterned region, and each column of the hollowed-out parts 15 includes a plurality of openings 100 arranged at intervals along the second direction (referring to the Y direction in FIG. 1); the patterned region includes two first edges 13 (see FIG. 4) oppositely arranged in the first direction, a column of hollowed-out part 15 near one of the first edges 13 extends along a first arc, and a column of hollowed-out part 15 near the other first edge 13 extends along a second arc, with convex side of the first arc is oriented toward convex side of the second arc, and the first direction and the second direction are perpendicular.

Metallic materials have relatively high modulus (10 GPa-200 GPa), relatively strong hardness and rigidity, which can provide good overall support and rigidity supplement for flexible display module, and can also correct the problems of high temperature softening and stress creep. However, the metal with high hardness is difficult to machine, and the edge of the bendable region 11 is prone to stress concentration, and the edge position is prone to long-time large stress failure or high-cycle dynamic bending failure. By the provision of the patterned region, the maximum bending stress of the bendable region 11 can be reduced, the bending ability of the metal support 22 can be improved, and the problem of stress concentration of the metal support 22 can be effectively alleviated, and the reliability of the metal support 22 can be improved.

Figure 2:
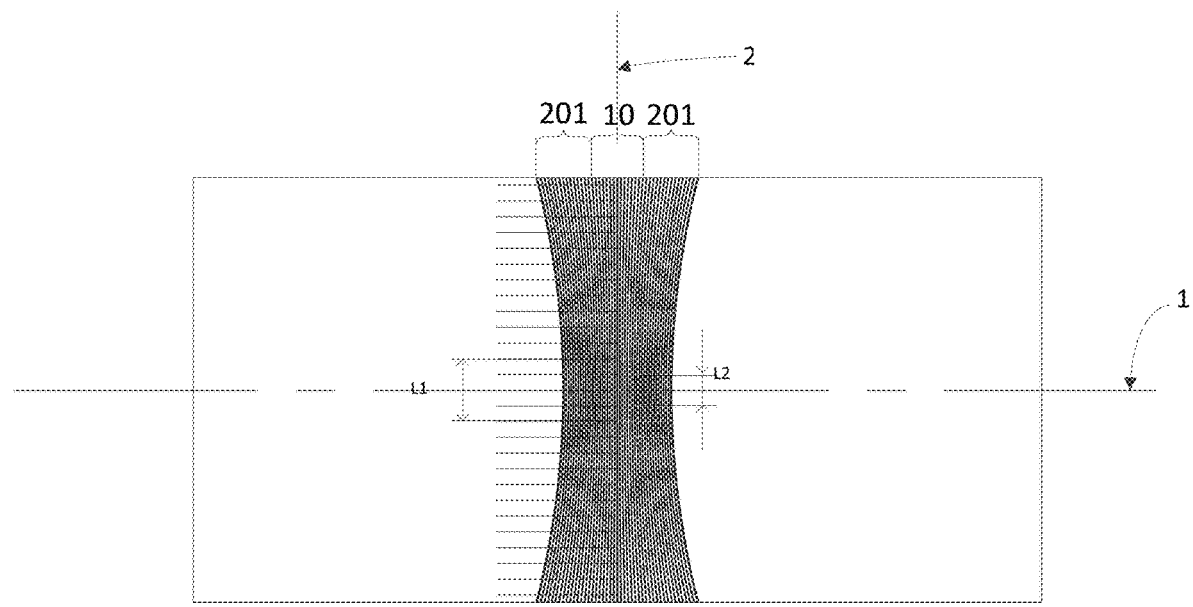
FIG. 2 is schematic diagram of patterned regions in an embodiment of the present disclosure.

It should be noted that in practical applications, the arc-shaped arrangement of the hollowed-out part 15 can be drawn with reference to the stress distribution contour in a simulation result of the support, or designed and drawn after adjustment is made according to the stress distribution contour, and FIG. 1 is a schematic diagram of the stress distribution contour. FIG. 2 is a schematic diagram of arranging patterned regions by forming openings according to stress distribution contours.

Figure 3:
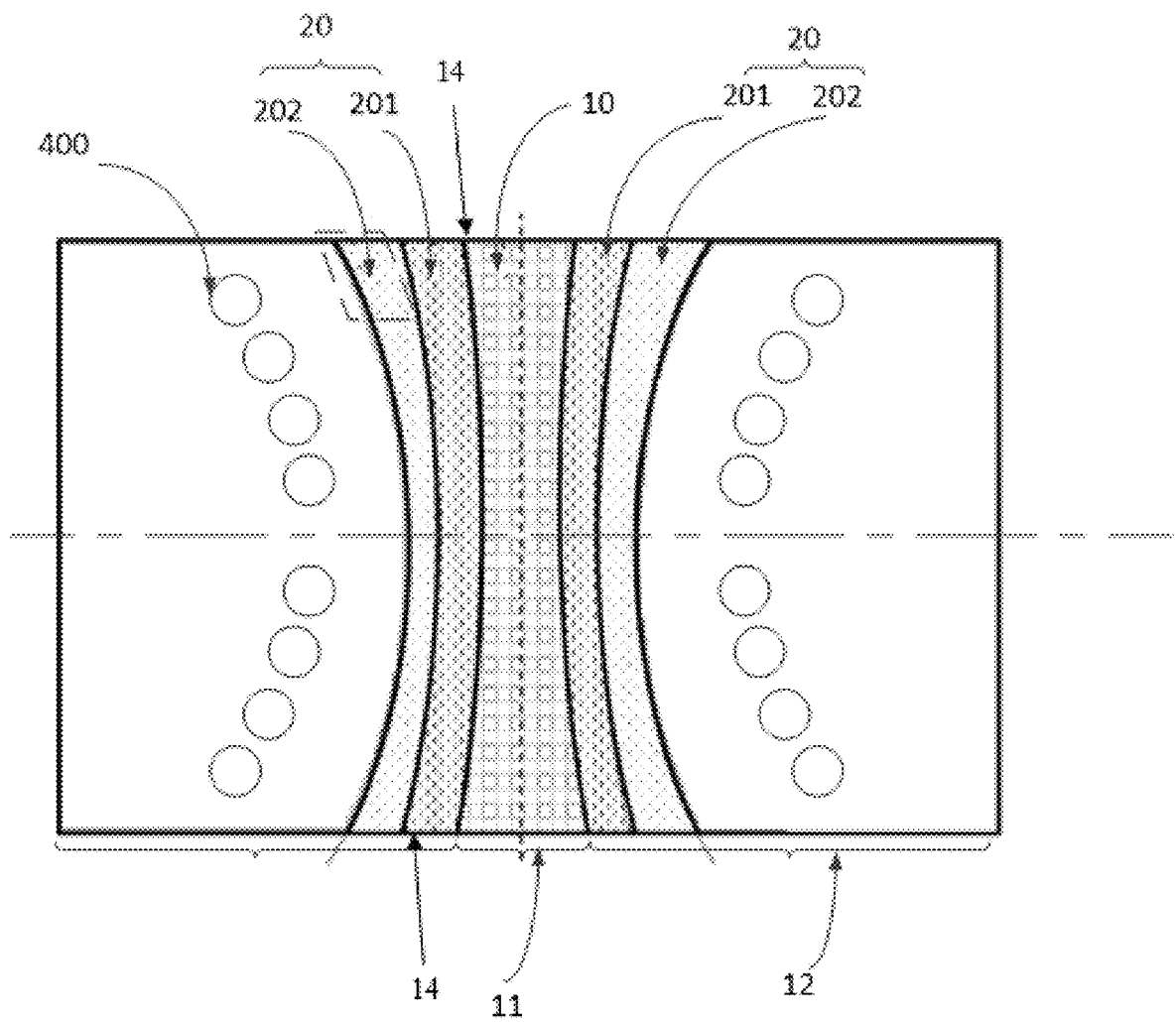
FIG. 3 is schematic diagram of a metal support in an embodiment of the present disclosure.

It should be noted that the bendable region 11 and the non-bendable region 12 are arranged at intervals, and one bendable region 11 and the non-bendable regions 12 located at two sides of the bendable region 11 are shown in FIG. 3, but are not limited thereto. The number of the bendable regions 11 and the number of the non-bendable regions can be set according to actual needs.

The patterned region may be provided only on the bendable region 11, or may be provided on the bendable region 11 while covering part of the non-bendable region 12 adjacent to the bendable region 11.

In the present embodiment, the bendable region 11 includes a first center line 1 extending in the first direction and a second center line 2 extending in the second direction, and a plurality of columns of the hollowed-out parts 15 are symmetrically distributed relative to the first center line 1 and symmetrically distributed relative to the second center line 2. The first center line 1 is perpendicular to the second center line 2, referring to FIG. 2.

And the plurality of columns of the hollowed-out parts 15 are symmetrically distributed relative to the first center line 1 and symmetrically distributed relative to the second center line 2, namely, the plurality of columns of the hollowed-out parts 15 are symmetrically arranged relative to a center point of the patterned region, so as to improve the stress uniformity of the metal support 22.

Figure 4:
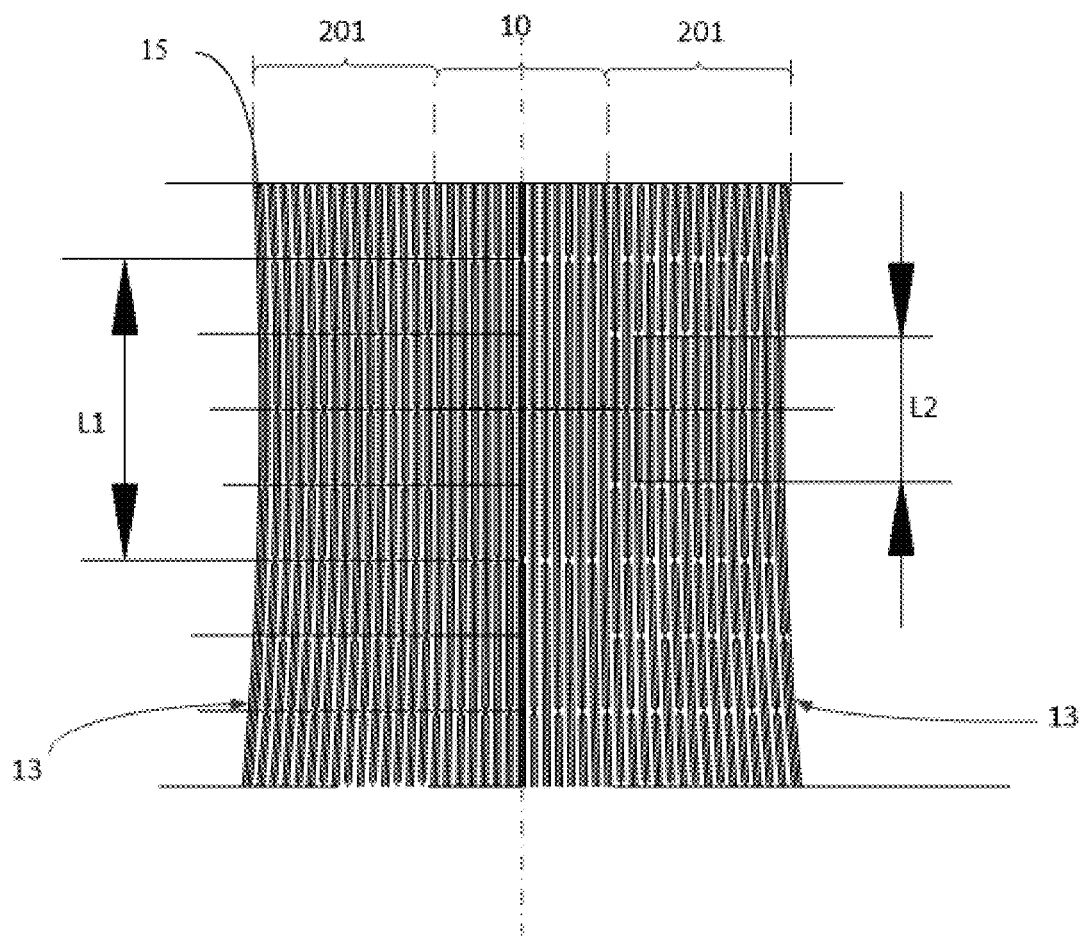
FIG. 4 is partial enlarged view 1 of FIG. 2.

In a particular embodiment, not only the hollowed-out part 15 near the first edge 13 is arc-shaped, a first hollowed-out part 15 is provided at the second center line 2 extending in the second direction, and the first hollowed-out part 15 is a linear structure extending in the second direction. With reference to FIG. 4, the hollowed-out parts 15 located on both sides of the first hollowed-out part 15 are all arc-shaped structures, and the degree of bending of the hollowed-out parts 15 located on both sides of the first hollowed-out part 15 increases with the increase of the distance from the first hollowed-out part 15.

In the present embodiment, the first patterned region 10 located in the middle part and the second patterned region 20 symmetrically arranged on two opposite sides of the first patterned region 10 are realized in the first direction, wherein the first patterned region 10 includes at least a first column of hollowed-out parts 15, and the long axis of each opening 100 in the first column of hollowed-out parts 15 coincides with the second center line.

The first column of hollowed-out parts 15 has a linear structure, a connecting line of a center point of each opening 100 in the first column of hollowed-out parts 15 coincides with the second center line, and the first column of hollowed-out parts 15 is located at a bending axis of a bendable region, which is beneficial to stress dispersion.

The second patterned region 20 is symmetrically arranged on both sides of the first patterned region 10 along the first direction, so as to facilitate the uniformity of stress distribution, the distance from the second center line is different along the first direction, the stress is different when bending, the patterned regions are partitioned to facilitate the corresponding stress distribution according to the different stress of different regions.

In the present embodiment, in the first patterned region 10 and the second patterned region 20, except for the first column of hollowed-out parts 15, a connecting line of the center points of the plurality of openings 100 in each column of the hollowed-out parts 15 forms an arc line, and along the first direction, the farther the arc line is from the second center line, the greater the radian of the arc line is.

The edge of the bendable region 11 is prone to stress concentration, and the edge position is prone to long-time large stress failure or high-cycle dynamic bending failure; and the hollowed-out parts 15 located at two sides of the first column of hollowed-out parts 15 are arranged in an arc shape according to the stress distribution of the metal support 22, however, in order to form the curved direction of the hollowed-out part 15, the connecting line of the center points of the plurality of openings 100 in each column of the hollowed-out part 15 forms the arc line, and the arc line coincides with the arc line at the corresponding position of the stress distribution of the metal support 22, so that the plurality of openings 100 in each column of hollowed-out parts 15 are located on the arc line of stress distribution to facilitate stress dispersion.

In one embodiment of the present embodiment, each of the openings 100 is of a strip-shaped structure extending along the extension direction of the hollowed-out part 15, and the arc line is tangent to the long axis of each opening 100 corresponding to the arc line.

The arrangement of the openings 100 influences the effect of stress dispersion, and the arc line is tangent to the long axis of each opening 100 corresponding to the arc line, so that the extension direction of the plurality of openings 100 on each column of hollowed-out parts 15 is arranged along the curved direction of the arc line, and thus the extension direction of each column of hollowed-out parts 15 is closer to the stress distribution line of the metal support 22.

In the present embodiment, the second patterned region 20 includes a third patterned region 201 and a fourth patterned region 202 along the first direction, the third patterned region 201 is adjacent to the first patterned region 10, the first patterned region 10 covers the bendable region, the third patterned region 201 and the fourth patterned region 202 cover part of the non-bendable region, with reference to FIG. 4.

When the metal support 22 is bent, the patterned region is subjected to a smaller stress, while an unpatterned region adjacent to the patterned region is subjected to a larger stress, and a larger stress concentration exists at a junction of the patterned region and the unpatterned region of the metal support 22, and stress concentration tends to cause the support to break.

The edge, away from the first patterned region 10 of the third patterned region 201 has a greater degree of curvature than the first patterned region 10, degree of curvature of the fourth patterned region 202 is greater than that of the third patterned region 201, and the first patterned region 10, the third patterned region 201 and the fourth patterned region 202 have different stress dispersion effects; the third patterned region 201 and the fourth patterned region 202 form a stress buffer region, and the arrangement of the third patterned region 201 and the fourth patterned region 202 reduces stress difference between the position where the patterned region is arranged and the position adjacent to the patterned region and without patterned region, so as to prevent the metal support 22 from breaking.

In the embodiment of the present embodiment, in order to avoid the above-mentioned situation, in the case where the patterned region covers the bendable region 11, a part of the non-bendable region 12 is also covered, specifically, the first patterned region 10 covers the bendable region. The third patterned region 201 and the fourth patterned region 202 cover part of the non-bendable region, that is, a width of the patterned region in the first direction is greater than the width of the bendable region 11, thus, the junction of the patterned region and the unpatterned region is located at the non-bendable region 12, and the metal support 22 is bent along the bendable region 11, thus avoiding stress concentration occurring at the bendable region 11; furthermore, the metal support 22 is prevented from being broken when bending along the bendable region 11, and the metal support 22 is ensured to have a good bending capability, but the greater the non-bendable region 12 covered by the patterned region, the lower the rigidity of the metal support 22; therefore, in the present embodiment, it is preferable to arrange a third patterned region 201 and a fourth patterned region 202 on both sides of the first patterned region 10, respectively, so that the stress of the patterned region and the unpatterned region is buffered, and the stress difference is reduced to avoid the occurrence of breakage.

When the metal support 22 is bent along a bending axis of the bendable region 11 (the bending axis coincides with a second center line extending along the second direction), the force direction of the metal support 22 is parallel to the first direction. Considering that if the openings 100 in two adjacent columns of the hollowed-out parts 15 face each other, a solid part between the two adjacent rows of the openings 100 is continuous in the second direction, and thus when the metal support 22 is bent along the bending axis of the bendable region 11, the solid part between the two adjacent rows of openings 100 is subjected to a large stress, and the bendable region 11 is easily broken.

Figure 5:
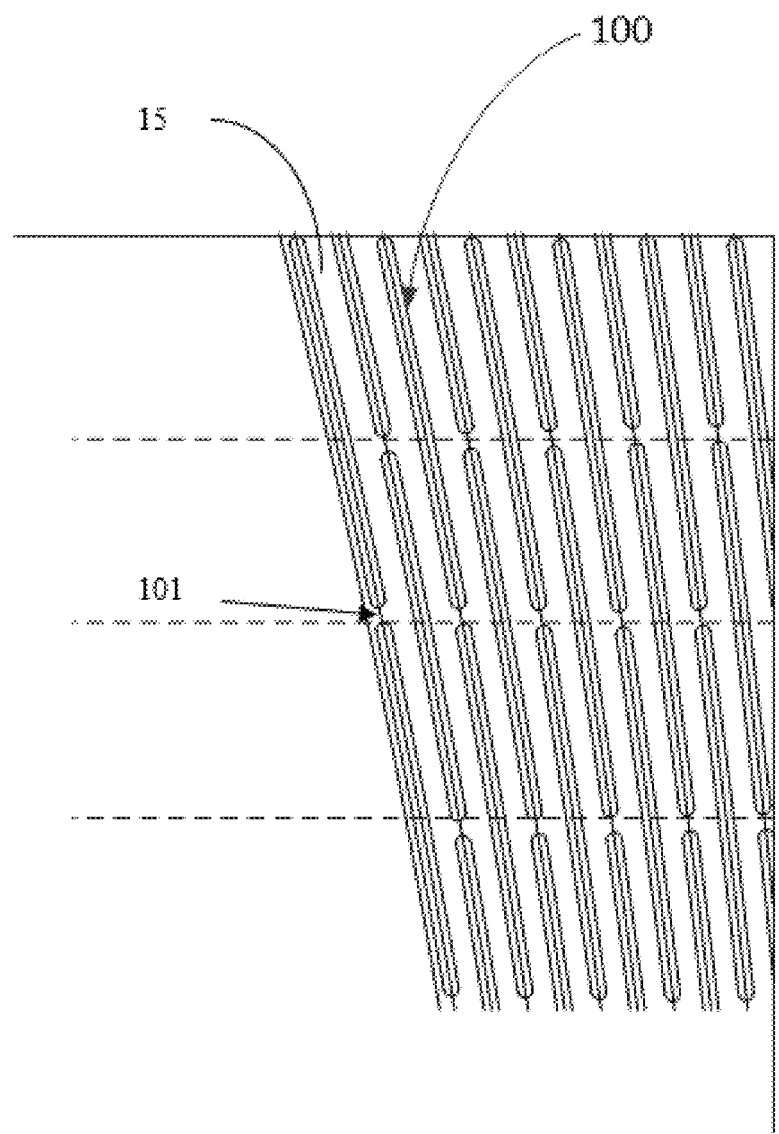
FIG. 5 is partial enlarged view 2 of FIG. 2.
Figure 6:
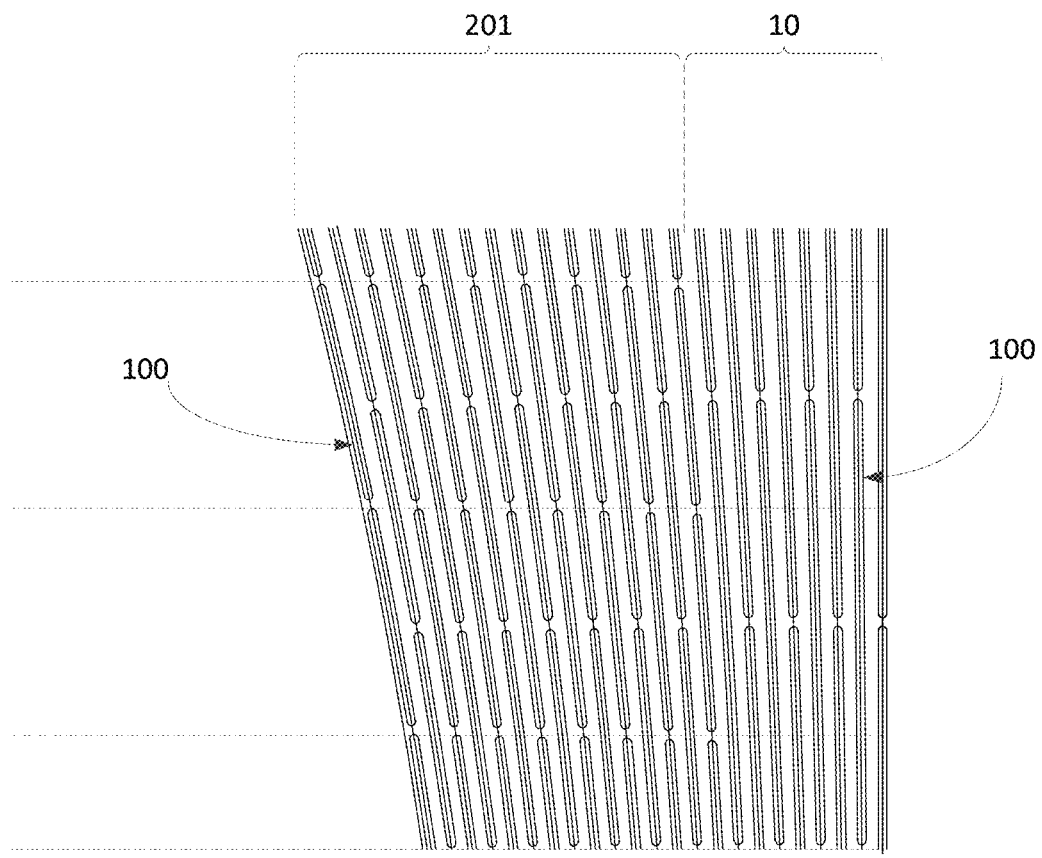
FIG. 6 is partial enlarged view 3 of FIG. 2.
Figure 7:
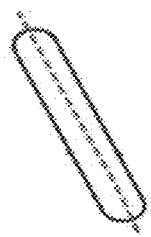
FIG. 7 is a schematic diagram 1 of an opening in an embodiment of the present disclosure.
Figure 8:
FIG. 8 is a schematic diagram 2 of an opening in an embodiment of the present disclosure.

In order to solve the above-mentioned problem, in one embodiment of the present embodiment, a connection part 101 is arranged between two adjacent openings 100 in each column of the hollowed-out parts 15, and the projection of the connection part 101 in the first direction is located on the corresponding openings 100 of the adjacent hollowed-out parts 15, namely, as shown in FIGS. 5 and 6, the openings 100 on two adjacent columns of the hollowed-out parts 15 are arranged in a staggered manner, so that the solid part (the connection part 101) is prevented from extending in a direction perpendicular to the bending axis of the bendable region 11, thereby preventing the bendable region 11 of the metal support 22 from being broken when the metal support 22 is bent.

The lengths of the plurality of openings 100 in the plurality of columns of hollowed-out parts 15 in the second direction may be the same and may be different, and the arrangement of the plurality of openings 100 is set according to actual needs, then the position of the connection part 101 between two adjacent openings 100 in one column of the hollowed-out parts 15 is different from the position of the connecting part between adjacent openings in other column of hollowed-out parts 15.

In one embodiment of the present embodiment, in two adjacent columns of hollowed-out parts 15 located in the same region, the connection part 101 between two adjacent openings 100 in one column of the hollowed-out parts 15 is a first connection part, the openings 100, corresponding to the first connection part, on the other column of the hollowed-out parts 15 are first openings 100, and the projection of the first connection part in the first direction is located at one-half of the first opening 100, that is, a line connecting the center of the first opening and the center of the first connection part is parallel to the first direction, with reference to FIGS. 5 and 6; and FIG. 5 shows a part of the third patterned region 201.

In one embodiment of the present embodiment, the connection part 101 between two adjacent openings 100 in one column of the hollowed-out parts 15 in the third patterned region 201 is a second connection part, the opening 100, corresponding to the second connection part, in one column of the hollowed-out parts 15 in the first patterned region 10 is the second opening 100, and the projection of the second connection part in the first direction is located at a quarter of the second opening 100, that is, there is a first quarter point on a long axis of the second opening, and a distance between the first quarter point and the nearest long axis endpoint of the second opening is one fourth of the long axis length of the second opening, a line connecting the first quarter point and the center of the second connection part is parallel to the first direction, with reference to FIGS. 5 and 6.

In one embodiment of the present embodiment, the connection part 101 between two adjacent openings 100 in one column of the hollowed-out parts 15 in the fourth patterned region 202 is a third connection part, the opening 100, corresponding to the third connection part, in one column of the hollowed-out parts 15 in the third patterned region 201 is the third opening 100, and the projection of the third connection part in the first direction is located at a quarter of the third opening 100, that is, there is a second quarter point on a long axis of the third opening, and a distance between the second quarter point and the nearest long axis endpoint of the third opening is one fourth of the long axis length of the third opening, a line connecting the second quarter point and the center of the third connection part is parallel to the first direction.

In one embodiment of the present embodiment, the length of the opening 100 in the hollowed-out part 15 in the first patterned region 10 in the second direction is a first length. The length of the opening 100 in the hollowed-out part 15 of the third patterned region 201 in the second direction is a second length, and the length of the opening 100 in the hollowed-out part 15 of the fourth patterned region 202 in the second direction is a third length.

The first length is twice the second length, and the second length is twice the third length, with reference to FIGS. 5 and 6.

The plurality of openings 100 of the hollowed-out part 15 in the same region have the same length, while the plurality of openings 100 of the hollowed-out part 15 in different regions have different lengths, and the length of the openings 100 of the hollowed-out part 15 farther away from the second center line is smaller, but this is not a limitation.

In the present embodiment, each of the openings 100 is of a strip-shaped structure extending along the extension direction of the hollowed-out part 15, and the arc line coincides with the long axis of each opening 100 corresponding to the arc line.

The connection line of the center points of the plurality of openings 100 in each column of the hollowed-out parts 15 forms the arc line, and the arc line coincides with the long axis of each opening 100 corresponding to the arc line. Specifically, the opening 100 is rectangular; or, in the case that the shape of the opening 100 is composed of a rectangle and two semicircles respectively located on two opposite short sides of the rectangle, in some embodiments, the extension direction of a long side of the rectangle coincides with the extension direction of the hollowed-out part 15 where the rectangle is located, namely, the position corresponding to the hollowed-out part 15 is a straight line, then the long side of the rectangle is a straight line, and the position corresponding to the hollowed-out part 15 is an arc, then the long side of the rectangle is also an arc. With reference to FIGS. 5-8, the center line of the opening 100 extending along the length direction is consistent with the extension direction of the corresponding hollowed-out part 15, and the long side of the opening 100 is parallel to the center line of the opening 100 extending along the length direction; and the long side of the opening 100 in FIG. 7 and the center line extending along the length direction of the opening 100 are both straight lines, while the long side of the opening 100 in FIG. 8 and the center line extending along the length direction of the opening 100 are both arc-shaped, so the bending tendency of the hollowed-out part 15 is ensured, and the stress can be effectively reduced, which is beneficial for bending and further avoiding breaking during bending.

In some embodiments of this embodiment, the plurality of openings 100 in the same column of hollowed-out parts 15 do not have the exact same length.

When the radian of the arc is large, the length of the opening 100 in the corresponding hollowed-out part 15 is too large to be set, and the setting of the same length is not conducive to the overlapping of the arc line and the long axis of the corresponding opening 100, and thus the stress dispersion effect will be reduced; in order to better follow the curved direction of the arc line, the lengths of the plurality of openings 100 in the same column of hollowed-out parts 15 are not exactly the same.

It should be noted that inexact same length includes completely different lengths (the length of any two of the openings 100 is different) of the plurality of openings 100 in the same column of the hollowed-out part 15, and partially same and partially different lengths of the plurality of openings 100 in the same column of the hollowed-out part 15.

In one embodiment of the present embodiment, the width of the openings 100 in each column of the hollowed-out parts 15 in the first direction is 0.2 mm, and the distance between two adjacent columns of the hollowed-out parts 15 in the first direction is 0.4 mm.

Multiple columns of the hollowed-out parts 15 in the patterned region have the same width in the first direction, and two adjacent columns of the hollowed-out parts 15 have the same distance in the first direction, so as to improve the uniformity of stress distribution, but this is not a limitation.

In the present embodiment, the length of the patterned region in the first direction gradually increases from the center to the edge along its extension direction.

The stress of the edge of the bendable region in the second direction is relatively concentrated when bending, and the length of the patterned region in the first direction gradually increases from the center to the edge along its extension direction, so the problem of relatively concentrated stress at the edges of the bendable region in the second direction can be effectively alleviated, as shown in FIGS. 1-4.

In the present embodiment, the arrangement density of the openings 100 in the patterned region gradually decreases from the middle to the edge in the second direction, with reference to FIGS. 5 and 6. FIGS. 5 and 6 are only schematic diagrams of a part of the openings near the edge of the bendable region in the second direction, but from which it can be obtained that the arrangement density of the openings 100 in the patterned region gradually decreases from the middle to the edge in the second direction, the openings 100 are arranged along the bending degree of the corresponding hollowed-out parts 15, and the center line of the openings 100 extending along the second direction is consistent with the bending tendency of the corresponding hollowed-out parts 15.

In this embodiment, the openings 100 are through holes or semi-through holes.

In the present embodiment, each of the openings 100 is of a strip-shaped structure extending along the extension direction of the hollowed-out part 15.

In the present embodiment, the shape of the opening 100 is not limited, and the opening 100 may be in a regular or irregular shape such as a circle, an oval, a rectangle, a polygon, or a combination thereof; and the shapes of the openings 100 in each column of the hollowed-out part 15 may be the same, may not be completely the same, or may be completely different.

In a specific embodiment of the present embodiment, each of the openings 100 has a strip-shaped structure and is composed of a rectangle and two semicircles respectively located at two opposite short sides of the rectangle, and there is no sharp corner, so that stress concentration at the ends of the rectangle can be avoided, and breaking of the metal support 22 can be avoided when the metal support 22 is bent along the bendable region 11.

In this embodiment, the patterned region includes two second edges 14 arranged opposite in the second direction. The openings 100, near the second edge 14, of the plurality of columns of hollowed-out parts 15 include a first opening penetrating the second edge 14 and a second opening not penetrating the second edge 14, wherein the first opening and the second opening are arranged at intervals.

The edge openings 100, near the second edge 14, of the plurality of columns of the hollowed-out parts 15 all have a certain distance from the second edge 14, namely, the part between the second edge 14 and the edge openings is a non-hollowed-out solid part, when bending, the part between the second edge 14 and the edge opening is a non-hollowed-out solid part which is subjected to a greater stress, and the bendable region 11 is easily broken. In the present embodiment, the arrangement of the first opening 1001 slows down the stress on the part, which is the non-hollowed-out solid part, between the second edge 14 and the edge opening, so as to prevent the edge of the bendable region 11 from breaking.

In an embodiment of the present embodiment, the patterned region includes two second edges 14 arranged opposite to each other along the second direction, and the openings 100, in the second edge 14, of the plurality of columns of the hollowed-out parts 15 all penetrate through the second edges 14, namely, the openings 100, in the second edge 14, of the plurality of columns of the hollowed-out parts 15 are all the first openings 1001, which effectively improves the flexibility force of the metal support 22 in the first direction, and prevents the edge of the bendable region 11 from breaking.

In the present embodiment, the openings 100 are filled with an elastic material.

The elastic material may be rubber, silica gel, PU, or the like, which improves the bending ability of the bendable region.

The thickness of the elastic material may be set according to actual needs, and in one embodiment of this embodiment, the thickness of the elastic material ranges from 0.001 mm to 0.5 mm, but this is not a limitation.

In the present embodiment, an adhesive layer on the bendable region 11 and the non-bendable region 12 is further included, wherein the adhesive layer includes a first surface close to the bendable region 11 and a second surface opposite to the first surface, a part, corresponding to the bendable region 11, of the first surface has a protrusion part for filling the openings 100, and the second surface has a planar structure.

The arrangement of the adhesive layer reduces the difficulty of the process of filling the opening with the elastic material and simplifies the process flow, and the connection of the metal support 22 and the corresponding parts can be achieved by means of the adhesive layer.

In the present embodiment, a plurality of assembly sites 400 for assembling with the flexible display panel 21 are provided on the metal support 22, and the plurality of the assembly sites 400 are symmetrically provided on both sides of the first center line of the metal support 22 extending in the first direction. The number of the assembly sites 400 located on one side of the first center line is double, improving the stress uniformity of the metal support 22, referring to FIG. 3.

Figure 9:
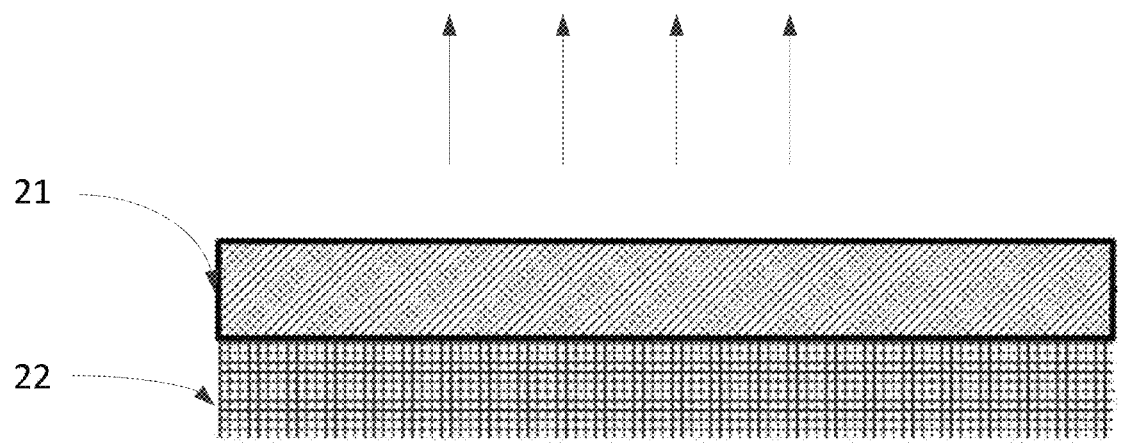
FIG. 9 is a schematic structural diagram of a display device in an embodiment of the present disclosure.

Embodiments of the present disclosure also provide a flexible display device, referring to FIG. 9, and the flexible display device includes the metal support 22 as described above.

The flexible display device includes a flexible display panel 21, in a particular embodiment, the flexible display panel 21 is an OLED display panel, and the metal support 22 is located on a backlight side of the flexible display panel 21, and in an implementation in which the flexible display device includes a backlight assembly, the backlight assembly is positioned between the flexible display panel 21 and the metal support 22.

The above-described embodiments are merely preferred embodiments of the present disclosure. It should be noted that some improvements and modifications may also be made by those of ordinary skill in the art without departing from the principle of the present disclosure, and all fall within the scope of protection of the present disclosure.

What is claimed is:

1. A metal support comprising a bendable region, a non-bendable region, and at least one patterned region covering at least the bendable region, wherein the bendable region is capable of bending along a first direction, a plurality of columns of hollowed-out parts arranged side by side along the first direction are arranged in the patterned region, each column of the plurality of columns of hollowed-out parts comprises a plurality of openings arranged at intervals along a second direction, the patterned region comprises two first edges arranged opposite to each other in the first direction, a column of the plurality of columns of hollowed-out parts near one of the first edges extends along a first arc, and a column of the plurality of columns of hollowed-out parts near the other first edge extends along a second arc, with convex side of the first arc is oriented toward convex side of the second arc, wherein the first direction and the second direction are perpendicular, and both the first direction and the second direction are parallel to a plane of the metal support;

wherein the bendable region includes a first center line extending in the first direction and a second center line extending in the second direction, the plurality of columns of hollowed-out parts are symmetrically distributed about the first center line, and symmetrically distributed about the second center line, and the first center line is perpendicular to the second center line;

wherein the metal support comprises a first patterned region at a middle part and a second patterned region symmetrically disposed on opposite sides of the first patterned region in the first direction, the first patterned region comprises at least a first column of the plurality of columns of hollowed-out parts, and a long axis of each of the plurality of openings in the first column of the plurality of columns of hollowed-out parts coincides with the second center line.

2. The metal support according to claim 1, wherein a connecting line of center points of a plurality of openings in each column of the plurality of columns of hollowed-out parts in the first patterned region and the second patterned region other than the first column of the plurality of columns of hollowed-out parts forms an arc line, and along the first direction, the farther the arc is from the second centerline, the greater the radian of arc line is.

3. The metal support according to claim 2, wherein each of the plurality of openings in each column of the plurality of columns of hollowed-out parts is of a strip-shaped structure extending along an extension direction of hollowed-out parts in each column of the plurality of columns of hollowed-out parts, and the arc line is tangent to a long axis of each of the plurality of openings corresponding to the arc line.

4. The metal support according to claim 2, wherein the second patterned region comprises a third patterned region and a fourth patterned region along the first direction, the third patterned region is adjacent to the first patterned region, the first patterned region covers the bendable region, and the third patterned region and the fourth patterned region cover a part of the non-bendable region.

5. The metal support according to claim 4, wherein a connection part is arranged between two adjacent openings in each column of the plurality of columns of hollowed-out parts, the plurality of openings on two adjacent columns of the plurality of columns of hollowed-out parts are arranged in a staggered manner.

6. The metal support according to claim 5, wherein in two adjacent columns of the plurality of columns of hollowed-out parts located within the same patterned region, one column of the two adjacent columns of the plurality of columns of hollowed-out parts comprises a plurality of openings and a first connection part arranged between two adjacent ones of the plurality of openings, the other column of the two adjacent columns of the plurality of columns of hollowed-out parts comprises a plurality of first openings, a line connecting a center of one of the plurality of first openings and a center of the connection part is parallel to the first direction.

7. The metal support according to claim 5, wherein one column of the plurality of columns of hollowed-out parts in the third patterned region comprises a plurality of openings and a second connection part arranged between two adjacent ones of the plurality of openings in the one column of the plurality of columns of hollowed-out parts in the third patterned region, one column of the plurality of columns of hollowed-out parts in the first patterned region comprises a plurality of second openings, there is a first quarter point on a long axis of one of the plurality of second openings, and a distance between the first quarter point and the nearest long axis endpoint of the one of the plurality of second openings is one fourth of the long axis length of the one of the plurality of second openings, a line connecting the first quarter point and a center of the second connection part is parallel to the first direction.

8. The metal support according to claim 5, wherein one column of the plurality of columns of hollowed-out parts in the fourth patterned region comprises a plurality of openings and a third connection part arranged between two adjacent ones of the plurality of openings in the one column of the plurality of columns of hollowed-out parts in the fourth patterned region, one column of the plurality of columns of hollowed-out parts in the third patterned region comprises a plurality of third openings, there is a second quarter point on a long axis of one of the plurality of third openings, and a distance between the second quarter point and the nearest long axis endpoint of the one of the plurality of third openings is one fourth of the long axis length of the one of the plurality of third openings, a line connecting the second quarter point and a center of the third connection part is parallel to the first direction.

9. The metal support according to claim 4, wherein a length of the openings in the hollowed-out part in the first patterned region in the second direction is a first length, a length of the openings in the hollowed-out parts in the third patterned region in the second direction is a second length, and a length of the openings in the hollowed-out parts in the fourth patterned region in the second direction is a third length; and the first length is twice the second length, and the second length is twice the third length.

10. The metal support according to claim 2, wherein each of the plurality of openings is of a strip-shaped structure extending along an extension direction of the hollowed-out part, and the arc line coincides with a long axis of each of the plurality of openings corresponding to the arc line.

11. The metal support according to claim 10, wherein the plurality of openings in the same column of the plurality of columns of hollowed-out parts do not have exactly same length.

12. The metal support according to claim 2, wherein a width of the plurality of openings in each column of the plurality of columns of hollowed-out parts in the first direction is 0.2 mm and a distance between centers of hollowed-out parts in two adjacent columns of the plurality of columns of hollowed-out parts in the first direction is 0.4 mm.

13. The metal support according to claim 1, wherein a length of the patterned region in the first direction first decreases and then increases along the second direction.

14. The metal support according to claim 1, wherein an arrangement density of the plurality of openings in the patterned region gradually decreases from a center to an edge in the second direction;

wherein the plurality of openings is through hole or semi-through hole; and
wherein the plurality of openings is filled with elastic materials.

15. The metal support according to claim 1, wherein the patterned region comprises two second edges oppositely disposed along the second direction, the openings, in at least one of the second edges, of the plurality of columns of the hollowed-out parts comprise a first opening penetrating the second edge and a second opening not penetrating the second edge, and the first opening and the second opening are arranged at intervals.

16. The metal support according to claim 1, wherein the patterned region includes two second edges oppositely disposed along the second direction, and the openings, in two second edges, of the plurality of columns of the hollowed-out parts penetrate through the second edges, each of two second edges is formed as a discontinuous linear shape.

17. The metal support according to claim 1, further comprising an adhesive layer located on the bendable region and the non-bendable region, wherein the adhesive layer comprises a first surface close to the bendable region and a second surface opposite to the first surface, part, corresponding to the bendable region, of the first surface has a protrusion part for filling the plurality of openings, and the second surface is of a planar structure.

18. A flexible display device, comprising:
a flexible display panel;
a backlight assembly; and
a metal support,
wherein the metal support is located on a backlight side of the flexible display panel, and the backlight assembly is arranged between the flexible display panel and the metal support;
wherein the metal support comprises a bendable region, a non-bendable region, and at least one patterned region covering at least the bendable region, wherein the bendable region is capable of bending along a first direction, a plurality of columns of hollowed-out parts arranged side by side along the first direction are arranged in the patterned region, each column of the plurality of columns of hollowed-out parts comprises a plurality of openings arranged at intervals along a second direction, the patterned region comprises two first edges arranged opposite to each other in the first direction, a column of the plurality of columns of hollowed-out parts near one of the first edges extends along a first arc, and a column of the plurality of columns of hollowed-out parts near the other first edge extends along a second arc, with convex side of the first arc is oriented toward convex side of the second arc, wherein the first direction and the second direction are perpendicular, and both the first direction and the second direction are parallel to a plane of the metal support;
wherein the bendable region includes a first center line extending in the first direction and a second center line extending in the second direction, the plurality of columns of hollowed-out parts are symmetrically distributed about the first center line, and symmetrically distributed about the second center line, and the first center line is perpendicular to the second center line;
wherein the metal support comprises a first patterned region at a middle part and a second patterned region symmetrically disposed on opposite sides of the first patterned region in the first direction, the first patterned region comprises at least a first column of the plurality of columns of hollowed-out parts, and a long axis of each of the plurality of openings in the first column of the plurality of columns of hollowed-out parts coincides with the second center line.

* * * * *